(12) United States Patent
Yu et al.

(10) Patent No.: US 8,356,238 B2
(45) Date of Patent: Jan. 15, 2013

(54) TRELLIS ENCODER FOR ENCODING DUAL TRANSMISSION STREAM

(75) Inventors: Jung-pil Yu, Suwon-si (KR); Hae-joo Jeong, Seoul (KR); Eui-jun Park, Seoul (KR); Joon-soo Kim, Seoul (KR); Yong-sik Kwon, Seoul (KR); Jin-Hee Jeong, Anyang-si (KR); Yong-deok Chang, Suwon-si (KR); Kum-ran Ji, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1911 days.

(21) Appl. No.: 11/508,144

(22) Filed: Aug. 23, 2006

(65) Prior Publication Data
US 2007/0092033 A1    Apr. 26, 2007

Related U.S. Application Data

(60) Provisional application No. 60/728,777, filed on Oct. 21, 2005, provisional application No. 60/734,295, filed on Nov. 8, 2005, provisional application No. 60/738,050, filed on Nov. 21, 2005, provisional application No. 60/739,448, filed on Nov. 25, 2005, provisional application No. 60/788,707, filed on Apr. 4, 2006.

(30) Foreign Application Priority Data

Jul. 20, 2006  (KR) .................. 10-2006-0068062

(51) Int. Cl.
*H03M 13/03* (2006.01)

(52) U.S. Cl. ..................................................... 714/792
(58) Field of Classification Search ................... 714/792
See application file for complete search history.

(56) References Cited

U.S. PATENT DOCUMENTS 5,537,430 A    7/1996   Park et al.
(Continued)

FOREIGN PATENT DOCUMENTS

CA    2677963 A1    11/2005
(Continued)

OTHER PUBLICATIONS

Office Action issued in Korean Patent No. 2006-68062 on Jun. 25, 2007.

(Continued)

*Primary Examiner* — Yolanda L Wilson
(74) *Attorney, Agent, or Firm* — Sughrue Mion, PLLC

(57) ABSTRACT

A trellis encoder for trellis encoding a dual transmission stream. A first multiplexer selectively outputs one of a predetermined first bit of the dual transmission stream and a value stored in a first memory according to an external control signal. A first adder adds the value output from the first multiplexer to the value stored in the first memory, outputs the added value, and stores the added value in the first memory. A second multiplexer selectively outputs one of a predetermined second bit of the dual transmission stream and a value stored in a second memory according to the external control signal. A second adder adds the value output from the second multiplexer to the value stored in the second memory and stores the added value in a third memory. Thus, an initialization is effectively performed before trellis encoding is performed.

12 Claims, 3 Drawing Sheets

U.S. PATENT DOCUMENTS

| | | | | |
|---|---|---|---|---|
| 7,639,751 | B2* | 12/2009 | Yu et al. | 375/265 |
| 7,823,052 | B2* | 10/2010 | Yu et al. | 714/784 |
| 7,844,885 | B2* | 11/2010 | Choi et al. | 714/784 |
| 8,111,768 | B2* | 2/2012 | Park et al. | 375/265 |
| 2001/0036232 | A1* | 11/2001 | Betts | 375/265 |
| 2003/0099303 | A1* | 5/2003 | Birru et al. | 375/265 |
| 2003/0103575 | A1 | 6/2003 | Birru et al. | |
| 2004/0028076 | A1 | 2/2004 | Strolle et al. | |
| 2005/0246614 | A1* | 11/2005 | Dati et al. | 714/792 |
| 2007/0300138 | A1* | 12/2007 | Motwani | 714/792 |

FOREIGN PATENT DOCUMENTS

| | | | |
|---|---|---|---|
| CA | 2677967 | A1 | 11/2005 |
| JP | 7-15356 | A | 1/1995 |
| JP | 10-322228 | A | 12/1998 |
| JP | 2004-533797 | A | 11/2004 |
| KR | 1999-76439 | | 10/1999 |
| KR | 10-2005-0107287 | A | 11/2005 |
| KR | 10-2005-0109052 | A | 11/2005 |
| WO | 03/003747 | A1 | 1/2003 |
| WO | 2004/043073 | A1 | 5/2004 |

OTHER PUBLICATIONS

International Search Report mailed on Feb. 5, 2007, in International Application No. PCT/KR2006/004303.
Written Opinion of the International Searching Authority mailed on Feb. 5, 2007, in International Application No. PCT/KR2006/004303.
U.S. Appl. No. 11/416,254, filed May 3, 2006, Jung-pil Yu et al., Samsung Electronics Co., Ltd.
U.S. Appl. No. 11/416,258, filed May 3, 2006, Yong-sik Kwon et al., Samsung Electronics Co., Ltd.
U.S. Appl. No. 11/416,457, filed May 3, 2006, Jung-pil Yu et al., Samsung Electronics Co., Ltd.
U.S. Appl. No. 11/503,970, filed Aug. 15, 2006, Jung-pil Yu et al., Samsung Electronics Co., Ltd.
U.S. Appl. No. 11/504,024, filed Aug. 15, 2006, Jung-pil Yu et al., Samsung Electronics Co., Ltd.
U.S. Appl. No. 11/504,027, filed Aug. 15, 2006, Jung-pil Yu et al., Samsung Electronics Co., Ltd.
U.S. Appl. No. 11/504,029, filed Aug. 15, 2006, Jung-pil Yu et al., Samsung Electronics Co., Ltd.
U.S. Appl. No. 11/504,030, filed Aug. 15, 2006, Jung-pil Yu et al., Samsung Electronics Co., Ltd.
U.S. Appl. No. 11/504,031, filed Aug. 15, 2006, Jung-pil Yu et al., Samsung Electronics Co., Ltd.
U.S. Appl. No. 11/504,038, filed Aug. 15, 2006, Jung-pil Yu et al., Samsung Electronics Co., Ltd.
U.S. Appl. No. 11/504,651, filed Aug. 16, 2006, Jung-pil Yu et al., Samsung Electronics Co., Ltd.
U.S. Appl. No. 11/504,724, filed Aug. 16, 2006, Jung-pil Yu et al., Samsung Electronics Co., Ltd.
U.S. Appl. No. 11/504,725, filed Aug. 16, 2006, Jung-pil Yu et al., Samsung Electronics Co., Ltd.
U.S. Appl. No. 11/504,726, filed Aug. 16, 2006, Jung-pil Yu et al., Samsung Electronics Co., Ltd.
U.S. Appl. No. 11/505,369, filed Aug. 17, 2006, Jung-pil Yu et al., Samsung Electronics Co., Ltd.
U.S. Appl. No. 11/505,894, filed Aug. 18, 2006, Eui-jun Park et al., Samsung Electronics Co., Ltd.
U.S. Appl. No. 11/523,716, filed Sep. 20, 2006, Jung-pil Yu et al., Samsung Electronics Co., Ltd.
U.S. Appl. No. 11/692,509, filed Mar. 28, 2007, Hae-joo Jeong et al., Samsung Electronics Co., Ltd.
"ATSC Standard: Digital Television Standard (A/53), Revision D, Including Amendment No. 1," Advanced Television Systems Committee, Jul. 19, 2005, pp. 1-67.
Kim, Jaebum et al., "A New Enhanced Coding Scheme for Robust Bit-stream of ATSC DTV," IEEE, 2005, pp. 1-7.
Communication, dated Jan. 31, 2012, issued by the Japanese Patent Office in corresponding Japanese Application No. 2008-536513.
Communication, dated Mar. 20, 2012, issued by the Korean Intellectual Property Office in corresponding Korean Application No. 10-2008-0036860.

* cited by examiner

FIG. 4

| SYNC | PID | AF Header | SRS | Turbo Data |
|------|-----|-----------|-----|------------|
| SYNC | PID | AF Header | SRS | Normal Data |
| SYNC | PID | AF Header | SRS | Normal Data |
| SYNC | PID | AF Header | SRS | Normal Data |
| 1 | 3 | 2 | S | 182-S |

TRELLIS ENCODER FOR ENCODING DUAL TRANSMISSION STREAM

CROSS REFERENCE TO RELATED APPLICATIONS

This application claims the benefit of Korean Application No. 2006-68062, filed Jul. 20, 2006, in the Korean Intellectual Property Office, the disclosure of which is incorporated herein by reference, and claims the benefit of U.S. Provisional Applications 60/728,777, 60/734,295, 60/738,050, 60/739,448 and 60/788,707 filed Oct. 21, 2005, Nov. 8, 2005, Nov. 21, 2005, Nov. 25, 2005 and Apr. 4, 2006, respectively, the disclosures of which are incorporated herein by reference.

BACKGROUND OF THE INVENTION

1. Field of the Invention

Aspects of the present invention relate to a trellis encoder for trellis encoding a transmission stream used for digital broadcasting, and more particularly, to an apparatus for trellis encoding and a method adopted in a transmission system, which generates and transmits a transmission stream into which a supplementary reference signal (SRS) is inserted to improve reception of an Advanced Television Systems Committee Vestigial Sideband (ATSC VSB) way as a United States terrestrial digital television (DTV) system, to trellis encode the transmission stream.

2. Description of the Related Art

An Advanced Television Systems Committee Vestigial Sideband (ATSC VSB) way, which is a United States terrestrial digital television (DTV) system, is a single carrier way and uses a field sync having 312 segments. Thus, reception is poor in a poor channel, particularly, a Doppler fading channel.

FIG. 1 is a block diagram of digital a broadcasting transmitting and receiving system according to standards of an Advanced Television Systems Committee Digital Television (ATSC DTV) as a general United States terrestrial digital broadcasting system. The digital broadcasting transmitter of the digital broadcasting transmitting and receiving system shown in FIG. 1 is an enhanced Vestigial Sideband (EVSB) system suggested by Philips and forms and transmits a dual stream including normal data of a standard ATSC VSB system to which robust data is added.

Referring to FIG. 1, the digital broadcasting transmitter includes a randomizer 11, a Reed-Solomon (RS) encoder 12, an interleaver 13, and a ⅔ rate trellis encoder 14 to perform error correction coding (ECC) on the dual stream. The randomizer 11 randomizes the dual stream. The RS encoder 12 is a concatenated coder adding parity bytes to a transmission stream to correct an error occurring in a transmission process due to channel characteristics. The interleaver 13 interleaves RS encoded data according to a predetermined pattern. The ⅔ rate trellis encoder 14 trellis encodes the interleaved data in a rate of ⅔ to map the interleaved data as 8-level symbols.

The digital broadcasting transmitter further includes a multiplexer 15 and a modulator 16. The multiplexer 15 inserts field syncs and segment syncs into data on which ECC has been performed as in a data format shown in FIG. 2. The modulator 16 adds a predetermined direct current (DC) value to data symbols into which segment sync signals and field sync signals have been inserted, to insert pilot tones and shape pulses to perform a VSB modulation on the data symbols and up-convert the data symbols into a signal in a radio frequency (RF) channel band.

Thus, in the digital broadcasting transmitter, normal data and robust data are multiplexed and input to the randomizer 11 using a dual stream way of transmitting normal data and robust data through a channel. The input data is randomized by the randomizer 11, outer encoded by the RS encoder 12 as an outer coder, and interleaved by the interleaver 13. Also, the interleaved data is inner encoded by the trellis encoder 14 in the unit of 12 symbols and mapped as 8-level symbols. Next, field sync signals and segment sync signals are inserted into the 8-level symbols. Pilot tones are inserted into the 8-level symbols to perform a VSB modulation on the 8-level symbols, up-convert the 8-level symbols into an RF signal, and transmit the RF signal.

The digital broadcasting receiver of the digital broadcasting transmitting and receiving system shown in FIG. 1 includes a tuner (not shown), a demodulator 21, an equalizer 22, a viterbi decoder 23, a deinterleaver 24, an RS decoder 25, and a derandomizer 26. The tuner converts the RF signal received through a channel into a baseband signal. The demodulator 21 detects sync signals from the baseband signal and demodulates the baseband signal. The equalizer 22 compensates for a channel distortion of the demodulated signal caused by a multi-path. The viterbi decoder 23 performs ECC on the equalized signal and demodulates the equalized signal into symbol data. The deinterleaver 24 re-arranges the data interleaved by the interleaver 13 of the digital broadcasting transmitter. The RS decoder 25 performs an error correction on the re-arranged data. The derandomizer 26 derandomizes the data error corrected by the RS decoder 25 and outputs a Moving Picture Experts Group-2 (MPEG-2) transmission stream.

Accordingly, the digital broadcasting receiver shown in FIG. 1 performs a reverse process to a process performed by the digital broadcasting transmitter. In other words, the broadcasting receiver down-converts the RF signal into the baseband signal, demodulates and equalizes the baseband signal, and channel decodes the demodulated and equalized signal to restore an original signal.

FIG. 2 is a view illustrating a VSB data frame of a United States digital broadcasting (8-VSB) system into which segment sync signals and field sync signals are inserted. As shown in FIG. 2, one frame includes two fields, and one of the two fields includes a field sync segment as a first segment and 312 data segments. Also, in the VSB data frame, one segment corresponds to an MPEG-2 packet and includes a segment sync having 4 symbols and 828 data symbols.

Referring to FIG. 2, a segment sync signal as a sync signal and a field sync signal are used for synchronization and equalization in the digital broadcasting receiver. In other words, a field sync signal and a segment sync signal are known between the digital broadcasting transmitter and the digital broadcasting receiver and used as reference signals for the equalization in the digital broadcasting receiver.

In the United States terrestrial broadcasting system shown in FIG. 1, robust data is added to normal data of an existing ATSC VSB system to form and transmit a dual stream. Here, existing normal data is transmitted together with robust data.

However, in the United States terrestrial digital broadcasting system shown in FIG. 1, although the dual stream is transmitted through the addition of the robust data, poor reception of a multi-path channel is not improved in the multipath channel according to the existing normal data stream transmission. In other words, the improvement of a normal stream hardly contributes to improving the reception. Also, a turbo stream cannot greatly contribute to improving reception in a multi-path environment.

Techniques for inserting an SRS into a dual transmission stream have been developed to improve reception of a turbo stream. As a result, techniques for appropriately encoding the dual transmission stream including the SRS are required.

SUMMARY OF THE INVENTION

Accordingly, aspects of the present invention are intended to solve the above-mentioned and/or other problems, and an aspect of the present invention is to provide a trellis encoder adopted in a transmission system, which generates and transmits a transmission stream into which a supplementary reference signal (SRS) is inserted, to perform an initialization at an appropriate timing and trellis encode the transmission stream to appropriately encode a dual transmission stream.

According to an aspect of the present invention, a trellis encoder for trellis encoding a dual transmission stream, includes: first through third memories; a first multiplexer selectively outputting one of a predetermined first bit of the dual transmission stream and a value stored in the first memory according to an external control signal; a first adder adding the value output from the first multiplexer to the value stored in the first memory, outputting the added value, and storing the added value in the first memory; a second multiplexer selectively outputting one of a predetermined second bit of the dual transmission stream and a value stored in the second memory according to the external control signal; and a second adder adding the value output from the second multiplexer to the value stored in the second memory and storing the added value in the third memory.

If the added value of the second adder is stored in the third memory, a value pre-stored in the third memory may be shifted to and stored in the second memory.

If the external control signal is an initialization signal, the first multiplexer may select and output the value stored in the first memory, and the first adder may perform an exclusive OR on the value output from the first multiplexer and the value stored in the first memory and store the result value of the exclusive OR in the first memory to initialize the first memory.

If the first memory is initialized, the value stored in the first memory may be output as a first initial value.

If the external control signal is the initialization signal, the second multiplexer may select and output the value stored in the second memory, and the second adder may perform an exclusive OR on the value output from the second multiplexer and the value stored in the second memory and store the result value of the exclusive OR in the third memory to initialize the third memory.

If the third memory is initialized, the value stored in the second memory may be output as a second initial value.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 4 is a view illustrating a structure of a dual transmission stream encoded by the trellis encoder shown in FIG. 3, according to an embodiment of the present invention.

DETAILED DESCRIPTION OF THE PREFERRED EMBODIMENTS

Figure 1:
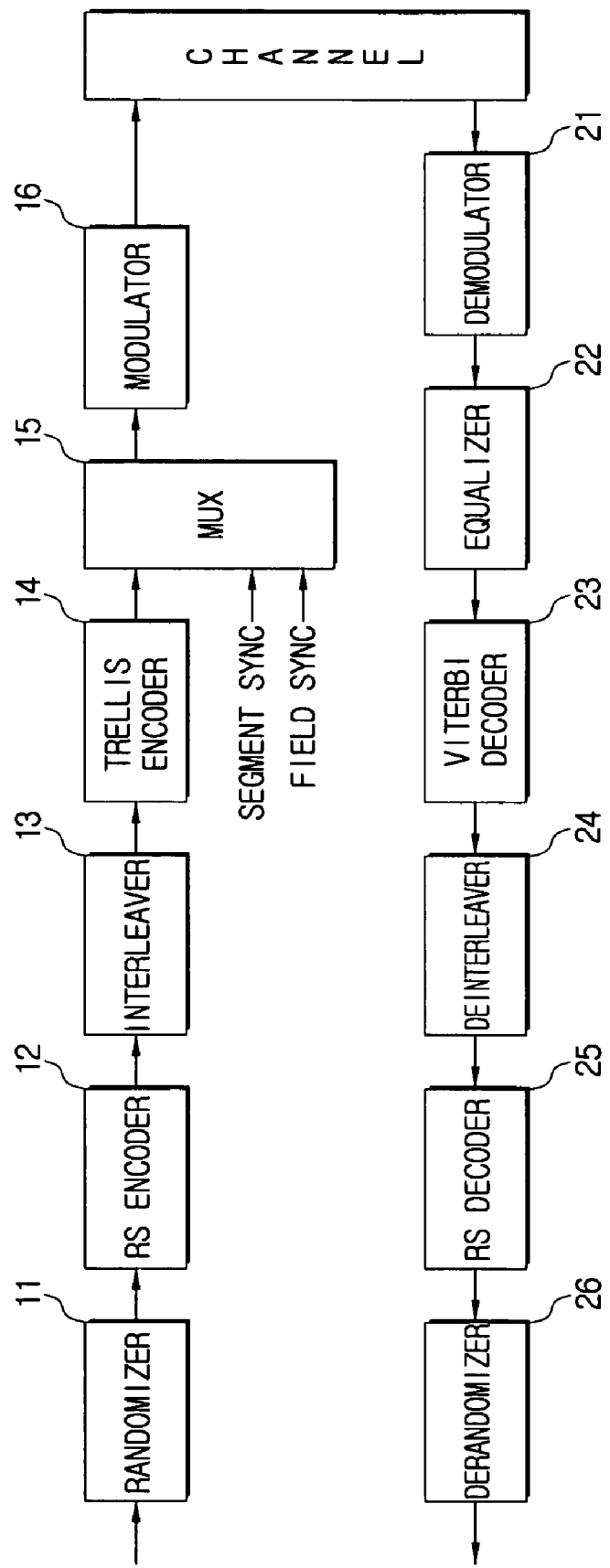
FIG. 1 is a block diagram illustrating a configuration of a conventional digital broadcasting (ATSC VSB) transmitting and receiving system.
Figure 2:
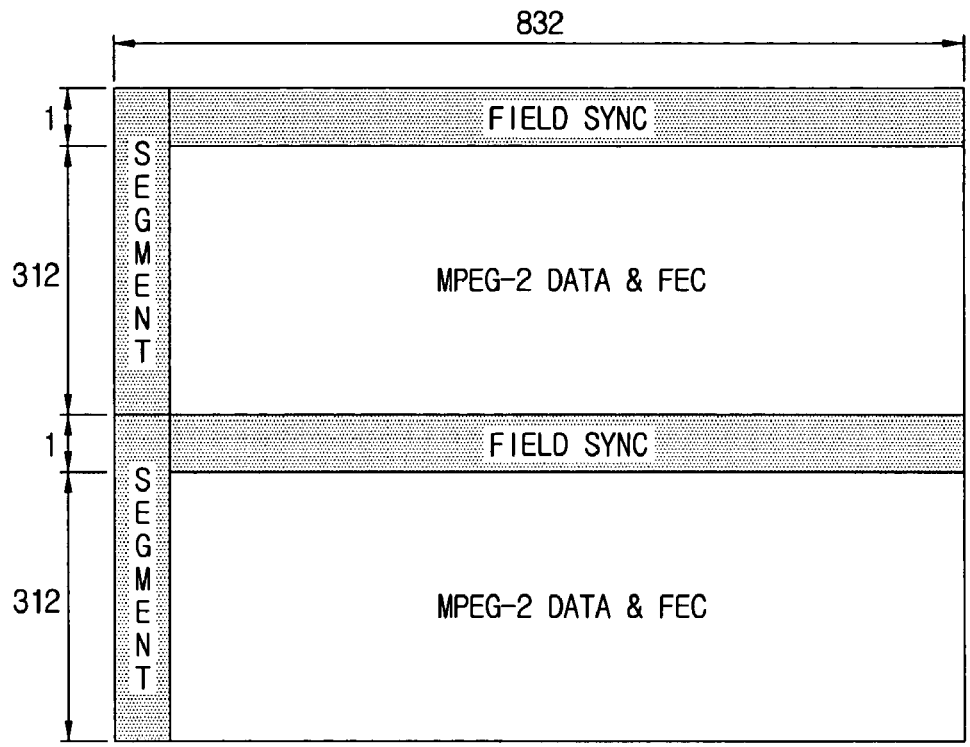
FIG. 2 is a view illustrating a frame structure of conventional Advanced Television Systems Committee Vestigial Sideband (ATSC VSB) data.

Reference will now be made in detail to the present embodiments of the present invention, examples of which are illustrated in the accompanying drawings, wherein like reference numerals refer to the like elements throughout. The embodiments are described below in order to explain the present invention by referring to the figures. The description includes detailed construction and elements to assist in a comprehensive understanding of the invention. Well known functions or constructions are not described in detail to avoid obscuring the invention in unnecessary detail.

Figure 3:
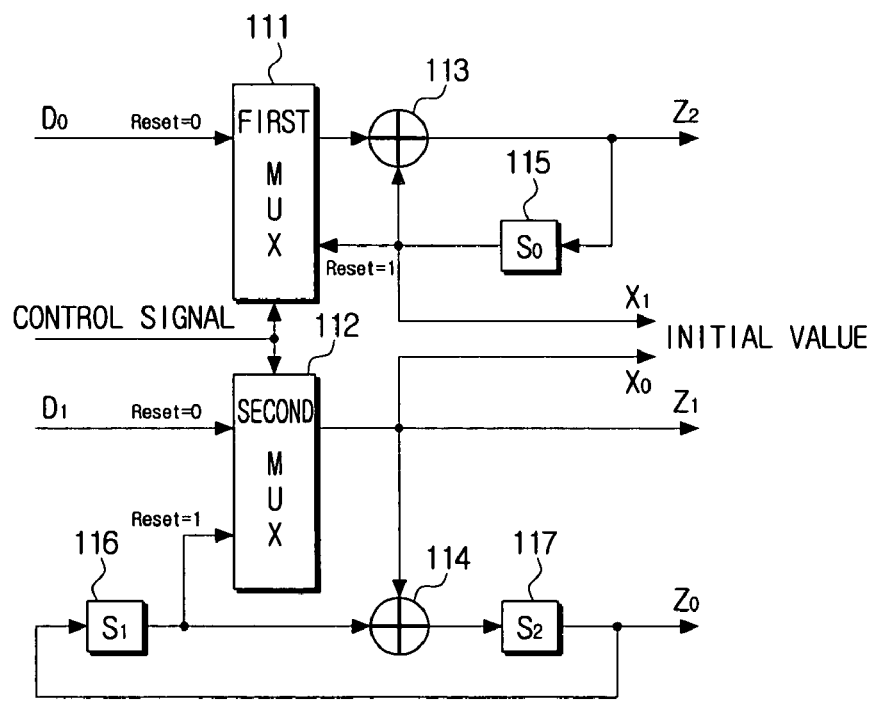
FIG. 3 is a view illustrating a configuration of a trellis encoder according to an embodiment of the present invention.

FIG. 3 is a view illustrating a configuration of a trellis encoder according to an embodiment of the present invention. Referring to FIG. 3, the trellis encoder includes first and second multiplexers 111 and 112, first, second, and third memories ($S_0$, $S_1$, and $S_2$) 115, 116, and 117, and first and second adders 113 and 114.

The trellis encoder shown in FIG. 3 receives and trellis encodes a dual transmission stream into which a supplementary reference signal (SRS) has been inserted. In this case, the trellis encoder performs an initialization immediately before trellis encoding an area of the dual transmission stream into which the SRS has been inserted. In other words, if a stream corresponding to a stuffing area of an adaptation field for initialization is input to the trellis encoder, the trellis encoder performs the initialization.

The initialization depends on an external control signal. In detail, a control signal having a value of "0" or "1" may be input to the first and second multiplexers 111 and 112. The control signal "1" may be used as an initialization signal, and the control signal "0" may be used as a general operation signal.

The first multiplexer 111 selects one of a value stored in the first memory $S_0$ 115 and a bit $D_0$ of the dual transmission stream and outputs the selected value to the first adder 113 according to the external control signal. In detail, if the control signal "1" is input, the first multiplexer 111 outputs the value stored in the first memory $S_0$ 115. If the control signal "0" is input, the multiplexer 111 outputs the bit $D_0$. The bit $D_0$ refers to a bit recorded in a stuffing area of the dual transmission stream for the initialization.

The second multiplexer 112 selects one of a value stored in the second memory $S_1$ 116 and an input bit $D_1$ and outputs the selected value to the second adder 114 according to the external control signal. In detail, if the control signal "1" is input, the second multiplexer 112 outputs the value stored in the second memory $S_1$ 116. If the control signal "0" is input, the second multiplexer 112 outputs the input bit $D_1$. The bit $D_1$ also refers to a bit recorded in the stuffing area of the dual transmission stream for the initialization.

The first adder 113 adds the value output from the first multiplexer 111 to the value stored in the first memory $S_0$ 115. "$Z_2$" is output as the value added by the first adder 113 and simultaneously stored in the first memory $S_0$ 115.

If the control signal "1" is input, the first multiplexer 111 selects and outputs the value stored in the first memory $S_0$ 115. Thus, two values input to the first adder 113 are equal. The first adder 113 performs exclusive OR, and thus a result value of the exclusive OR is "0." Thus, "0" is stored in the first memory 115, and thus the first memory $S_0$ 115 is initialized.

In this case, the existing value stored in the first memory 115 is output as a first initial value $X_1$. The first initial value $X_1$ may be used for a parity correction operation performed with an initialization.

If the control signal "1" is input, the second multiplexer 112 selects and outputs the value stored in the second memory $S_1$ 116. The value output from the second multiplexer 12 is "Z1" and provided to the second adder 114. The output value of the second multiplexer 112 is output as a second initial value $X_0$. The value stored in the second memory $S_1$ 116 is also directly provided to the second adder 114. The second adder 114 also performs exclusive OR, and thus a result value of the exclusive OR is "0." Since the result value of the exclusive OR performed by the second adder 114 is stored in the third memory $S_0$ 117, the third memory 117 is initialized to "0." Simultaneously, a value pre-stored in the third memory $S_2$ 117 is shifted to the second memory $S_1$ 116. Also, the value pre-stored in the third memory $S_2$ 117 is output as "$Z_0$."

If the control signal "1" is input again in this state, the value stored in the third memory $S_2$ 117, i.e., "0," is shifted to the second memory 116. Thus, the second memory 116 is also initialized. Simultaneously, the second multiplexer 112 outputs a value currently stored in the second memory $S_1$ 116, i.e., the value stored in the third memory $S_2$ 117 before the initialization, as the second initial value $X_0$.

The control signal "0" is output to the first and second multiplexers 111 and 112 in a non-initialization section. Thus, the bits $D_0$ and $D_1$ are separately selected and trellis encoded.

The control signal "0" or "1" may be received from an additional control signal generator (not shown).

As described above, if the initialization is performed, the trellis encoder outputs values corresponding to values pre-stored in internal memories as initial values.

Since the second and third memories $S_1$ 116 and $S_2$ 117 are disposed around the second multiplexer 112, a control signal having 2 symbols is required to initialize the second and third memories 116 and 117. Also, 8 initial value states "000, 111, 001, 010, 100, 110, 101, 011" may be formed using the first, second, and third memories $S_0$, $S_1$, $S_2$ 115, 116, and 117. Thus, parity may be changed using values of "$X_0$" and "$X_1$" corresponding to each of the 8 initial value The initialization process of the trellis encoder may be described in detail with reference to Table 1 below.

TABLE 1

| Reset at t = 0 | $(S_0 S_1 S_2)$ at t = 0 | $(X_0 X_1)$ at t = 0 | $(S_0 S_1 S_2)$ at t = 1 | $(X_0 X_1)$ at t = 1 | $(S_0 S_1 S_2)$ Next State at t = 2 | Output $(Z_2 Z_1 Z_0)$ |
|---|---|---|---|---|---|---|
| 1 | 0, 0, 0 | 0, 0 | 0, 0, 0 | 0, 0 | 0, 0, 0 | 000 |
| 1 | 0, 0, 1 | 0, 1 | 0, 0, 0 | 0, 0 | 0, 0, 0 | 000 |
| 1 | 0, 1, 0 | 0, 0 | 1, 0, 0 | 1, 0 | 0, 0, 0 | 000 |
| 1 | 0, 1, 1 | 0, 1 | 1, 0, 0 | 1, 0 | 0, 0, 0 | 000 |
| 1 | 1, 0, 0 | 1, 0 | 0, 0, 0 | 0, 0 | 0, 0, 0 | 000 |
| 1 | 1, 0, 1 | 1, 1 | 0, 0, 0 | 0, 0 | 0, 0, 0 | 000 |
| 1 | 1, 1, 0 | 1, 0 | 1, 0, 0 | 1, 0 | 0, 0, 0 | 000 |
| 1 | 1, 1, 1 | 1, 1 | 1, 0, 0 | 1, 0 | 0, 0, 0 | 000 |

As shown in Table 1 above, if the control signal, i.e., a reset signal, is "1" at t=0, the initialization starts, and $S_0$, $S_1$, and $S_2$ are all "0" at a time after t=2. Thus, the initialization is completed during the 2 symbol clock sections.

FIG. 4 is a view illustrating a structure of a dual transmission stream encoded by the trellis encoder shown in FIG. 3, according to an embodiment of the present invention. In one field of the dual transmission stream shown in FIG. 4, 78 turbo stream packets are inserted into 312 segment packets. In the dual transmission stream, a packet (188 bytes) of turbo streams and three packets (188 bytes) of normal streams are repeated in a ratio of 1:3. If 70 packets of turbo streams are inserted into 312 segments of the dual transmission stream, a packet of turbo streams and three packets of normal streams are repeated 70 times in a ratio of 1:3, and a remaining 32 packets are constituted as normal stream packets in the dual transmission stream. An SRS having an S byte size is inserted into each packet, and thus a size of a turbo stream is 182-S bytes.

As described above, a trellis encoder according to the embodiment of the present invention may be adopted in a transmission system, which generates and transmits a transmission stream into which an SRS is inserted, to trellis encode the transmission stream. In this case, an initialization may be performed before the SRS is encoded. Thus, the transmission stream into which the SRS is inserted may be normally processed and transmitted.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A trellis encoder for trellis encoding a dual transmission stream, the trellis encoder comprising:
   first, second and third memories;
   a first multiplexer selectively outputting one of a predetermined first bit of the dual transmission stream and a value stored in the first memory according to an external control signal;
   a first adder adding the value output from the first multiplexer to the value stored in the first memory, outputting the added value, and storing the added value in the first memory;
   a second multiplexer selectively outputting one of a predetermined second bit of the dual transmission stream and a value stored in the second memory according to the external control signal;
   a second adder adding the value output from the second multiplexer to the value stored in the second memory and storing the added value in the third memory.

2. The trellis encoder as claimed in claim 1, wherein if the added value of the second adder is stored in the third memory, a value pre-stored in the third memory is shifted to and stored in the second memory.

3. The trellis encoder as claimed in claim 2, wherein if the external control signal is an initialization signal, the first multiplexer selects and outputs the value stored in the first memory, and the first adder performs an exclusive OR on the value output from the first multiplexer and the value stored in the first memory and stores a result value of the exclusive OR in the first memory to initialize the first memory.

4. The trellis encoder as claimed in claim 3, wherein if the first memory is initialized, the value stored in the first memory is output as a first initial value.

5. The trellis encoder as claimed in claim 2, wherein if the external control signal is the initialization signal, the second multiplexer selects and outputs the value stored in the second memory, and the second adder performs an exclusive OR on the value output from the second multiplexer and the value stored in the second memory and stores a result value of the exclusive OR in the third memory to initialize the third memory.

6. The trellis encoder as claimed in claim 5, wherein if the third memory is initialized, the value stored in the second memory is output as a second initial value.

7. The trellis encoder as claimed in claim 4, wherein if the external control signal is the initialization signal, the second multiplexer selects and outputs the value stored in the second memory, and the second adder performs an exclusive OR on the value output from the second multiplexer and the value stored in the second memory and stores a result value of the exclusive OR in the third memory to initialize the third memory.

8. The trellis encoder as claimed in claim 7, wherein if the third memory is initialized, the value stored in the second memory is output as a second initial value.

9. A method of trellis encoding a dual transmission stream, the method comprising:
    storing first, second and third values;
    selectively outputting a fourth value as one of a predetermined first bit of the dual transmission stream and the first stored value according to an external control signal;
    adding the fourth value to the first stored value to output a fifth value, and replacing the first stored value with the fifth value;
    selectively outputting a sixth value as one of a predetermined second bit of the dual transmission stream and the second stored value according to the external control signal;
    adding the sixth value to the second stored value to output a seventh value;
    replacing the stored third value with the seventh value; and
    providing the fifth sixth and seventh values as encoded output values.

10. The method of claim 9, further comprising:
    replacing the stored second value with the stored third value.

11. The method as claimed in claim 10, further comprising:
    providing the external control signal as an initialization signal;
    selectively outputting the first value as the fourth value;
    performing an exclusive OR operation on the fourth value and the first value; and
    storing a result of the exclusive OR operation as the first value, to initialize the first value.

12. The method of claim 10, further comprising:
    providing the external control signal as an initialization signal;
    selectively outputting the second value as the sixth value;
    performing an exclusive OR operation on the on the sixth value and the second value;
    replacing the third value with a result of the exclusive OR operation, to initialize the third value.

* * * * *